(12) United States Patent
Rohleder et al.

(10) Patent No.: US 9,589,637 B1
(45) Date of Patent: Mar. 7, 2017

(54) STORAGE ELEMENT WITH STORAGE AND CLOCK TREE MONITORING CIRCUIT AND METHODS THEREFOR

(71) Applicant: FREESCALE SEMICONDUCTOR, INC., Austin, TX (US)

(72) Inventors: Michael Rohleder, Unterschleissheim (DE); Thomas Koch, Kaufering (DE); Harald Luepken, Zorneding (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/104,809

(22) PCT Filed: Dec. 18, 2013

(86) PCT No.: PCT/IB2013/061100
§ 371 (c)(1),
(2) Date: Jun. 15, 2016

(87) PCT Pub. No.: WO2015/092487
PCT Pub. Date: Jun. 25, 2015

(51) Int. Cl.
*G11C 14/00* (2006.01)
*G06F 21/55* (2013.01)
*G11C 29/02* (2006.01)
*G11C 7/10* (2006.01)

(52) U.S. Cl.
CPC .............. *G11C 14/00* (2013.01); *G11C 7/10* (2013.01); *G11C 29/023* (2013.01); *G06F 21/558* (2013.01)

(58) Field of Classification Search
CPC ......... G11C 14/00; G11C 29/023; G11C 7/10; G06F 21/558
See application file for complete search history.

(56) References Cited

U.S. PATENT DOCUMENTS

| 4,040,022 A | 8/1977 | Takii |
| 5,343,301 A | 8/1994 | Wesolowski |
| 5,471,488 A | 11/1995 | Bender |
| 6,163,172 A | 12/2000 | Bazuin et al. |
| 6,222,413 B1 | 4/2001 | Cahill |
| 6,343,096 B1 | 1/2002 | Davidsson et al. |

(Continued)

FOREIGN PATENT DOCUMENTS

WO  8707793 A1  12/1987

OTHER PUBLICATIONS

International Search Report for application PCT/IB2013/061100, Sep. 18, 2014, 12 pages.

*Primary Examiner* — Harry W Byrne
*Assistant Examiner* — Ajay Ojha

(57) ABSTRACT

A storage element with monitoring circuit, comprising a previous state information storage element configured to record a previous state of a monitored state information storage element, a state change indication unit having a clock input terminal coupled to the clock signal input interface, a state change indication unit being configured to generate a state change indication signal indicative of whether the monitored state information storage element shall have performed a state change by observing the data at a data input interface and a data output terminal, and a state change confirmation unit configured to generate a storage fault indicator by observing the data output terminal of the monitored state information storage element and the data output of the previous state information storage element and checking whether the result of this observation is in line with the state change indicator.

15 Claims, 4 Drawing Sheets

(56) References Cited

U.S. PATENT DOCUMENTS

| | | |
|---|---|---|
| 6,362,675 B1 | 3/2002 | Alwais |
| 7,428,694 B2 | 9/2008 | Pistoulet |
| 7,594,150 B2 | 9/2009 | Chakraborty et al. |
| 7,646,224 B2 | 1/2010 | Sundby |
| 7,679,404 B2 | 3/2010 | Neidengard |
| 7,859,313 B2 | 12/2010 | Chien et al. |
| 2009/0315603 A1 | 12/2009 | Bancel et al. |
| 2010/0169752 A1 | 7/2010 | Kuenemund |
| 2010/0308868 A1 | 12/2010 | Zinke et al. |

US 9,589,637 B1

STORAGE ELEMENT WITH STORAGE AND CLOCK TREE MONITORING CIRCUIT AND METHODS THEREFOR

FIELD OF THE INVENTION

This invention relates to a storage element with a storage and clock tree monitoring circuit and methods therefor, in particular for monitoring flip-flops or latches.

BACKGROUND OF THE INVENTION

The correct behaviour of storage elements like flip-flops or latches depend on a clock (or latch enable signal as the corresponding signal is named in case of a latch) being reliably provided at their respective clock input terminal. A failure to provide a valid clock or a compromised clock signal may result in invalid behaviour of the flip-flop, e.g. unintended overwriting of its value, storing an incorrect value or no storage at all. This may cause faults in subsequent logic components relying on the output of the flip-flop in question, thus putting the system in risk of device failures. Therefore, especially for safety critical applications, it is desirable to monitor the provision of clock signals to flip-flops in order to identify possible clock or storage issues. In many cases, clock monitors are employed that observe the related clock signals (which is only possible for the common clock path between the observed storage element(s) and the observer element), but do not check that the main feature of those storage elements, i.e. the storage function, has not been compromised.

FIG. 9 schematically depicts the viewpoint of a safety specification on the left hand side. On the right hand side of FIG. 9, a more realistic physical implementation within a semiconductor device is exemplarily depicted. A safety specification usually reflects the intention that the complete wire from the clock source 1001 to the flip-flop 1002 being part of a safety function is being observed using an observer 1005. However, the reality implemented within a semiconductor device is impacted by the need to distribute the clock signal from its single source 1001 to multiple (sometimes several thousands) flip-flops 1002; this requires several levels of clock buffers 1007 (which are named "clock tree") to provide the required drive strength to the clock ports of all those flip-flops. This is due to the fact that the clock buffers used can only drive a limited amount of subsequent elements. Furthermore the required routing of the corresponding clock wires 1003 over the semiconductor device results in the ability to only observe a portion of the clock wires (the common portion 1004 of the path from the clock source to the observed flip-flop 1002 and a clock observer 1005). A possibly very large portion 1006 of the remaining path may not be observed at all.

Furthermore, many safety applications observe the recorded value within those storage elements to identify failures due to an inadvertent change of such a value (which might be caused by environmental effects, e.g. alpha or beta particles or gamma rays) and try to at least detect and sometimes even correct such failures. A prominent example for such a functionality is the Triple Voting Flop (TVP); three redundant flip-flops with a subsequent voting logic that select the final value based on a majority vote—thus having the capability to provide the correct value despite any single inadvertent change to one of its flip-flops that might have occurred.

Providing the capability to detect (or even correct) such incidents while also detecting failures of a storage element with respect to a compromised clock avoids the need for traditional clock observers and provides a higher coverage of the involved clock signals, due to the complete coverage of the involved sub-tree of the clock tree. It also enables a significantly increased coverage of the clock driving this clock tree, as well as the detection of incidents caused by a compromised clock.

The document WO 87/07793 A1 discloses a standard triple modular redundancy scheme based on a majority vote to reduce the impact of clock faults.

The document U.S. Pat. No. 7,594,150 B2 discloses a method for operating of a flip-flop that is tolerant to crosstalk faults by sampling the input data multiple times before and after the active clock edge. The final stored value at the flip-flop is determined by the resolution of a counter circuit residing in the flip-flop, which is activated at the change of the sampled input data.

The document U.S. Pat. No. 7,428,694 B2 discloses a logic circuit comprising a logic module comprising a functional synchronous flip-flop receiving a functional result comprising several bits in parallel, and supplying a synchronous result. A module for checking the integrity of the functional flip-flop includes a first coding block receiving the functional result and supplying a first code, a second coding block receiving the synchronous result and supplying a second code, a checking synchronous flip-flop receiving the first code and supplying a third code, and a comparator for comparing the second code with the third code and for supplying a first error signal.

There is, however, a need for improved solutions that are not only able to preserve data integrity of a storage element by redundant processing of the data, but are also able to verify the correct storage function of the storage element in combination with observing the involved clock tree.

SUMMARY OF THE INVENTION

The present invention provides a storage element with clock tree and storage monitoring circuit, a method for monitoring a storage element and a method for monitoring the related clock tree as described in the accompanying claims.

According to an aspect of the present invention the correct functioning of a state information storage element is monitored by observing the data at the data input interface and the data at the output terminal in order to check whether the monitored state information storage element should have performed a state change, by recording the previous state of the monitored state information storage element, and by observing the data at the output terminal of the monitored state information storage element and the recorded previous state of the monitored state information storage element in order to determine whether the result of this observation is in line with whether the state should have changed or not. By properly distributing the elements of the storage element with monitoring circuit within a clock tree it is possible to further monitor the proper distribution of the clock signal from the clock source to the flip-flops.

It should be noted that the phrase "in line with" may be understood in that the state change of the state information (recorded in the state information storage element) and the state change of the previous state information (recorded in the previous state information storage element) corresponds to each other with respect to one clock period and one storage cycle, respectively. The previous state information storage element is provided to record the previous state information of the state information storage element when new state information is recorded in the state information storage element.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
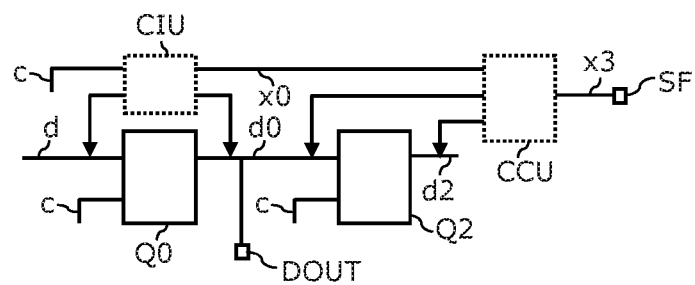
FIG. 1 schematically shows an exemplary embodiment of a storage element with monitoring circuit.

FIG. 1 schematically illustrates a storage element with monitoring circuit 10. The circuit 10 comprises a data input interface DIN, a data output interface DOUT, a clock signal input interface CLK, and a storage fault indicator interface SF. At the data input interface DIN, data items d are input to a state information storage element Q0 under monitoring. The state information storage element Q0 is fed with a clock c from the clock signal input interface CLK at a respective clock input terminal coupled to the clock signal input interface CLK. A data input terminal of the state information storage element Q0 is coupled to the data input interface DIN. Data processed by the state information storage element Q0 is output at a data output terminal as data output d0.

The data output d0 is input to a data input terminal of a state information storage element Q2 that is configured to record the previous state of the monitored state information storage element Q0. Since the state information storage element Q2 has a clock input terminal coupled to the clock signal input interface CLK and being clocked with the same clock c as the state information storage element Q0, the data output d2 at an output terminal of the previous state information storage element Q2 resembles the state of the state information storage element Q0 delayed by one clock period or storage cycle.

A state change indication unit CIU, which has a clock input terminal coupled to the clock signal input interface CLK and being clocked with the same clock c as the state information storage element Q0 and the state information storage element Q2, observes the data input d and the data output d0 of the state information storage element Q0 and compares the two detected states. When the data input d and the data output d0 are different, i.e. not equivalent, the state change indication unit CIU is configured to generate a state change indicator x0 indicative of whether the monitored state information storage element Q0 shall have performed a state change. The state change indicator x0 is fed to an input terminal of a state change confirmation unit CCU coupled to the state change indication unit CIU. The state change confirmation unit CCU observes the data d0 at the output terminal of the monitored state information storage element Q0 and the data d2 at the output terminal of the previous state information storage element Q2. When the result of this observation is in not in line with the state change indicator x0, i.e. when there is no difference between the output d0 of the monitored state information storage element Q0 and the previous state information d2 provided by the storage element Q2 although the state change indicator x0 indicated that the monitored state information storage element Q0 should have performed a state change, the state change confirmation unit CCU is configured to generate a storage fault indicator x3 at the storage fault indicator interface SF.

Figure 3:
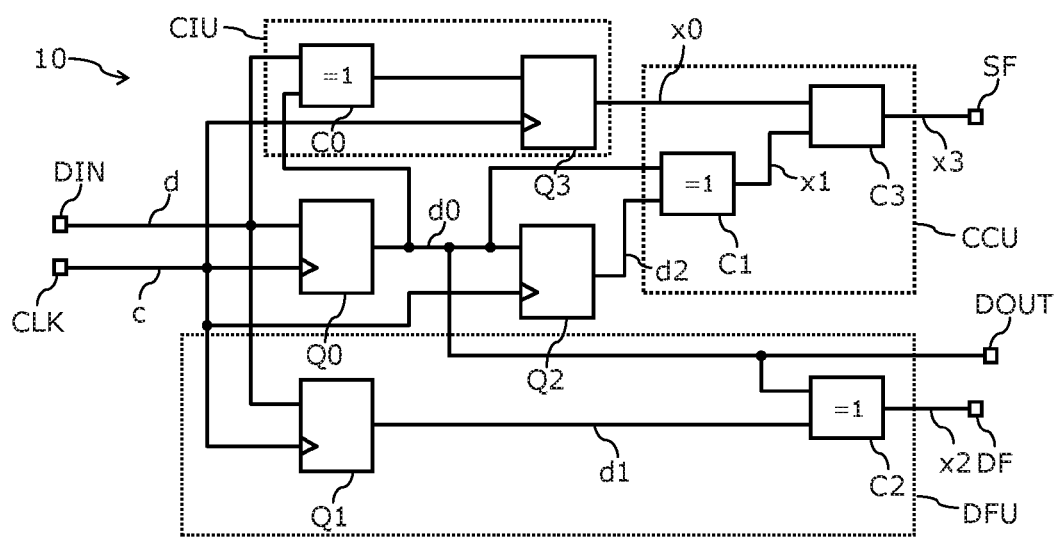
FIG. 3 schematically shows yet another exemplary embodiment of a storage element with monitoring circuit.

As schematically illustrated in FIG. 3 the storage element with monitoring circuit 10 may further comprise a data fault unit DFU that includes a clock input terminal coupled to the clock signal input interface CLK, a first data input terminal coupled to the data input interface DIN, and a second data input terminal coupled to the data output terminal of the monitored state information storage element Q0. The data fault unit DFU is configured to generate a data fault indicator x2 at a data fault indicator interface DF when the data recorded by the monitored state information storage element Q0 does not match a redundant copy of this data within the data fault unit DFU.

Alternatively, it may be possible to implement a data fault detection and correction unit DFCU instead of the data fault unit DFU, the data fault detection and correction unit DFCU having a clock input terminal coupled to the clock signal input interface CLK, a first data input terminal coupled to the data input interface DIN, and a second data input terminal coupled to the data output terminal of the monitored state information storage element Q0. The data fault detection and correction unit DFCU may further receive the storage fault indicator x3 at a third input terminal connected to the storage fault indicator interface SF. The data fault detection and correction unit DFCU may be configured to generate a data fault indicator x2 at the data fault indicator interface DF when the data recorded by the monitored state information storage element Q0 does not match a redundant copy of this data within the data fault detection and correction unit DFCU. Depending on the matching result, the data fault detection and correction unit DFCU may select an appropriately corrected data output to be output at the data output interface DOUT either from the data output terminal of the monitored state information storage element Q0 or a redundant copy of this data. For example, if neither the storage fault indicator x3 nor the data fault indicator x2 or only the data fault indicator x2 indicate a failure, the actual output of monitored state information storage element Q0 may be selected for output at the data output interface DOUT. However, if the storage fault indicator x3 or both, the storage fault indicator x3 and the data fault indicator x2 indicates that the state information recorded by the monitored state information storage element Q0 is erroneous, the data fault detection and correction unit DFCU may select the output of the redundant copy of the data d input at the monitored state information storage element Q0 as data output instead.

Figure 2:
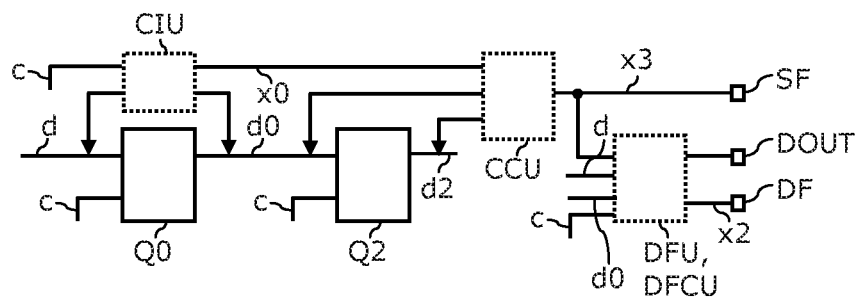
FIG. 2 schematically shows another exemplary embodiment of a storage element with monitoring circuit.

FIG. 3 schematically illustrates a more detailed diagram of the storage element with monitoring circuit 10 according to an exemplary variant of FIG. 1 or 2. For example, the state change indication unit CIU may comprise a first comparison element Q0 that has a first input terminal coupled to the data input interface DIN and a second input terminal coupled to the data output terminal of the monitored state information storage element Q0. At an output terminal thereof, a state change indication is input to a change indicator storage element Q3 that is clocked by the clock c at its clock input terminal which is coupled to the clock signal input interface CLK. The output terminal of the change indicator storage element Q3 may issue the state change indicator x0 at its output terminal in sync with the clock c.

The state change confirmation unit CCU may for example comprise a second comparison element C1 with a first input terminal coupled to the data output terminal of the monitored state information storage element Q0, and a second input terminal coupled to the data output terminal of the previous state information storage element Q2. Similar to the operation of the first comparison element C0, the second comparison element C1 compares the recorded state information of the monitored state information storage element Q0 and the recorded state information at the previous state information storage element Q2 in order to generate an output x1 indicative of whether the monitored state information storage element Q0 has changed its state. A storage check unit C3 is coupled to the output of the second comparison element C1 and the change indicator storage element Q3 of the state change indication unit CIU in order generate a storage fault indicator SF dependent on the state change indicator x0 and the output x1 of the second comparison element C1. The state change indicator x0 indicates whether a state change shall have occurred at the monitored state information storage element Q0. The output x1 of the second comparison element C1, on the other hand, indicates whether the monitored state information storage element Q0 has performed a state change. If these indications are equivalent, this means that the monitored state information storage element Q0 has correctly stored data d provided at its data input terminal. However, if these indications are not equivalent, it may be assumed that the monitored state information storage element Q0 failed to correctly store the data d input to its data input terminal, hence, the storage check unit C3 is able to issue a storage fault indicator x3 at the storage fault indicator interface SF which is indicative of whether or not the monitored state information storage element Q0 correctly stored data provided at its data input terminal.

The exemplary variant of FIG. 3 shows a storage element with monitoring circuit 10 according to FIG. 2 where a data fault unit DFU is implemented. The data fault unit DFU of FIG. 3 includes a redundant state information storage element Q1 that is clocked with the clock c at a clock input terminal coupled to the clock input signal interface CLK. The redundant state information storage element Q1 has further a data input terminal coupled to the data input interface DIN so that the redundant state information storage element Q1 may provide a redundant copy d1 of the data recorded by the monitored state information storage element Q0. In order to check for data faults, a third comparison element Q2 is configured to compare the data output d0 of the monitored state information storage element Q0 with the data output d1 of the redundant state information storage element Q1. If the data output d0 of the monitored state information storage element Q0 and the data output d1 of the redundant state information storage element Q1 are not equivalent, it may be assumed that a data fault occurred at the monitored state information storage element Q0. In this case, a data fault indicator x2 is issued at the data fault indicator interface DF.

Figure 4:
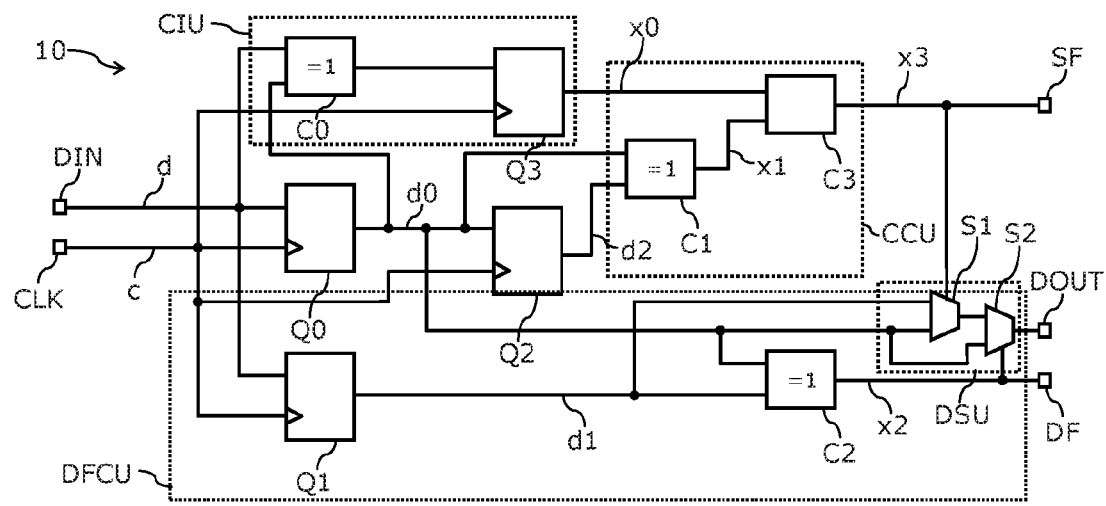
FIG. 4 schematically shows yet another exemplary embodiment of a storage element with monitoring circuit.

FIG. 4 schematically illustrates another variant of the storage element with monitoring circuit 10 with a data fault detection and correction unit DFCU being embodied. The circuit 10 of FIG. 4 differs from the circuit 10 of FIG. 3 mainly in that the data fault detection and correction unit DFCU further comprises a data selection unit DSU connected to the outputs of the monitored state information storage element Q0 and the redundant state information storage element Q1. The data selection unit DSU may be configured to select the appropriate output of one of the storage elements Q0 and Q1 depending on whether and what kind of fault has been detected. The data selection unit DSU may select one of the original data output d0 of the monitored state information storage element Q0 and the data output d1 output by the redundant state information storage element Q1, dependent on the storage fault indicator x3 and the data fault indicator x2. This may for example be done in a two-step selection stage which firstly considers whether a storage fault has occurred in a first selection unit S1 and secondly considers whether a data fault has occurred in a second selection unit S2. The selection units S1 and S2 are exemplarily illustrated as multiplexers, however, any similar logic or selectors may be chosen as well. Only if the combination of those faults indicates no error in the monitored state information storage element Q0, the original data output d0 of the monitored state information storage element Q0 may be output at the data output interface DOUT. In all other cases, it is relied upon the data output of the redundant state information storage element Q1 as being the correct data output.

In the shown embodiment, each of the storage elements Q0, Q1, Q2 and Q3 is implemented as flip-flop and described in relationship to the behaviour of flip-flops with clock inputs. Anybody skilled in the art will recognize that the same functionality can also be implemented with other storage elements, e.g. latches, which will show a slightly different behaviour with respect to their latch enable input.

Figure 5:
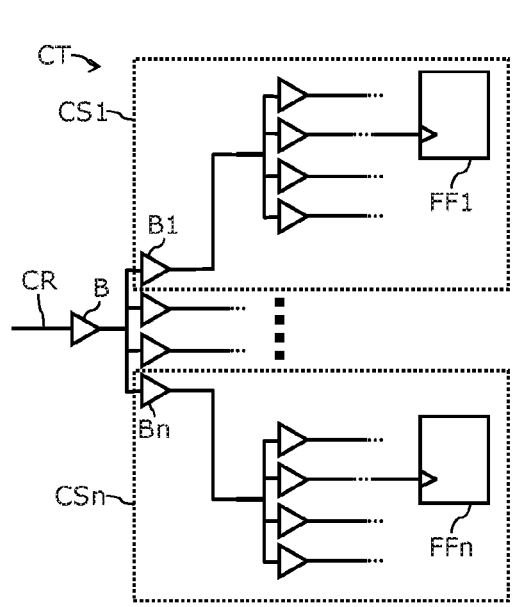
FIG. 5 schematically illustrates an exemplary clock tree.

The circuits 10 as illustrated and explained in FIGS. 1 to 4 may be implemented within an integrated circuit. Such an integrated circuit may comprise at least one of the aforementioned circuits 10. As exemplarily illustrated in FIG. 5, such an integrated circuit may include at least one clock root CR that is driving the clock input terminal of multiple clock subtrees CS1 to CSn. Each clock subtree may comprise a chain of one or more buffer elements B, Bi, Bij, . . . that route the clock from the clock root through the branches of the clock tree CT to at least one of the storage elements FFi. In the example of FIG. 5 the buffers B, B1, and B12 are driving the clock input terminal of FF1.

It is worth to note that any of the clock subtrees CSi may itself be considered a clock tree CTi, with the corresponding driving buffer B being the clock root CR of this clock tree CTi. As such these clock subtrees are recursively defined as (CSi, CSi+1, . . . , CSk), with the buffer driving the clock subtree CSi being itself the clock root of the clock subtrees CSi+1, with this definition recursively applied to all its clock subtrees until the final set of clock subtrees CSk.

Figure 5A:
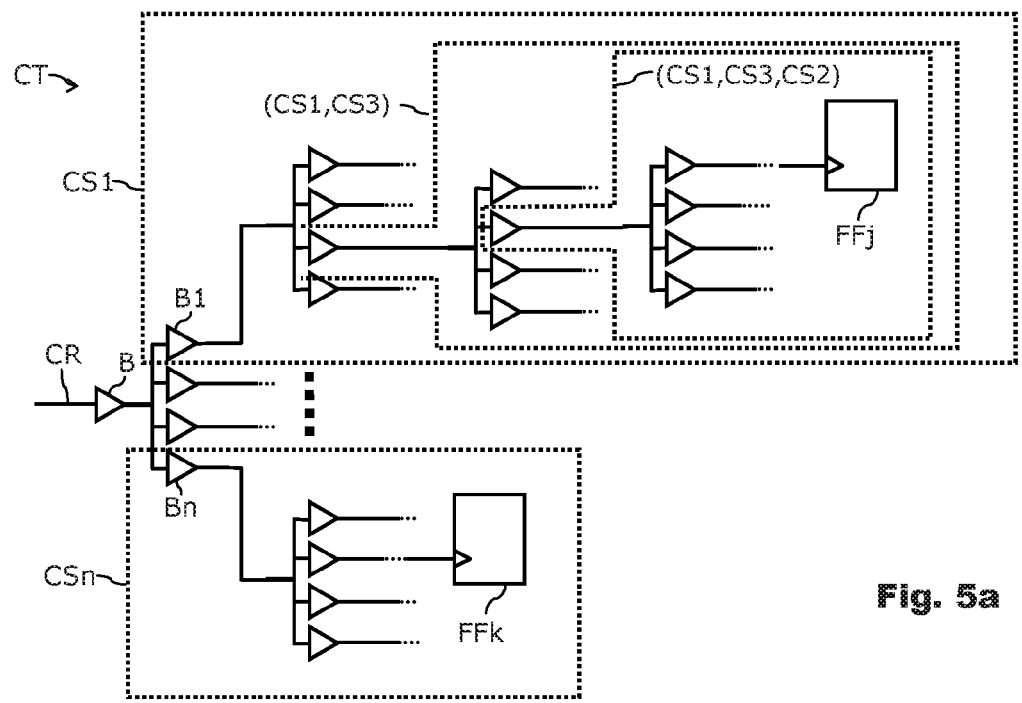
FIG. 5a schematically illustrates some subtrees of an exemplary clock tree.

Storage elements FF1 and FFn may be considered as being placed in one of the clock subtrees, if the clock provided to the storage elements is routed through the respective clock subtree CS1 and CSn. The clock subtree CS1 originates from the root buffer B1, whereas the clock subtree CSn originates from the root buffer Bn. It should be noted that the number of clock subtrees n is generally not limited. Moreover, each of the clock subtrees may hierarchically divided into further sub-subtrees, not explicitly shown in FIG. 5 due to reasons of clarity and lucidity. FIG. 5a illustrates this recursive definition on the example of two different clock subtrees (CS1, CS3, CS2) and (CSn) for two storage elements, FFj and FFk respectively.

Figure 6:
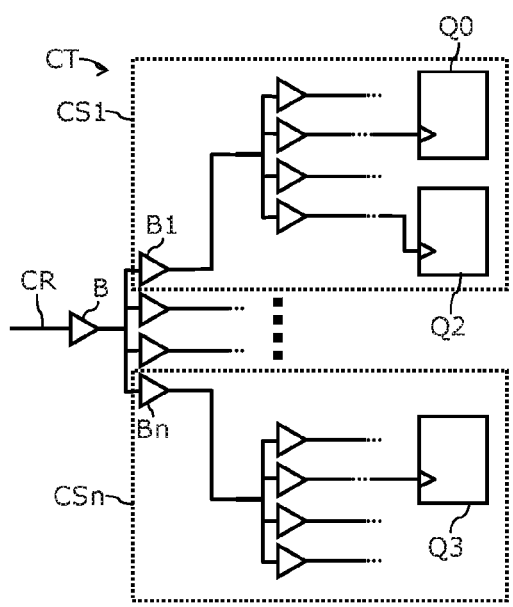
FIG. 6 schematically illustrates an exemplary clock tree with storage elements distributed among its subtrees.

A set of storage elements comprising at least the monitored state information storage element Q0, the change indicator storage element Q3 and the previous state information storage element Q2 of a first one of the circuits 10 of the integrated circuit may be either directly or indirectly driven by the clock root CR. As illustrated in FIG. 6, the set of storage elements may be divided according to a predetermined arrangement with respect to the clock subtrees. The change indicator storage element Q3 of the first one of the circuits 10 is arranged in a different clock subtree (CSn) than the clock subtree (CS1, CS2) driving the clock input terminal of the monitored state information storage element Q0 of the first one of the circuits 10. Similarly, the previous state information storage element Q2 of the first one of circuits 10 is arranged in a different clock signal subtree (CS1, CS4) than the clock signal subtree driving the clock input terminal of the respective change indicator storage element Q3. It is worth to note that the clock root (CS1) for both storage elements Q0 and Q2 differs by the clock root (CSn) for the storage element Q3, however, the clock tree for the storage elements Q0 and Q2 differs not with respect to its clock root CS1, but with respect to its subtrees driven by different clock roots (CS1, CS2) and (CS1, CS4).

In the example of FIG. 6, the monitored state information storage element Q0 and the previous state information storage element Q2 may be implemented in the clock subtree CS1, whereas the change indicator storage element Q3 may be implemented in the clock subtree CSn. Additionally, the redundant state information storage element Q1 may be implemented in a clock subtree different to the clock signal subtree driving the clock input terminal of the monitored state information storage element Q0 and/or the previous state information storage element Q2, for example in the clock subtree of the change indicator storage element Q3.

With the distribution of the storage elements Q0, Q2 and Q3 (and possibly Q1) among the different subtrees CS1 to CSn it becomes possible to determine whether a clock failure might have occurred. By combining the information from multiple storage elements with monitoring circuits 10 it might be even possible to determine the subtree in which a clock failure has occurred. If both a storage fault and a data fault are determined, the clock failure was present at the monitored state information storage element Q0, hence in the first clock subtree CS1. If only a data fault is determined, the clock failure was present at the redundant state information storage element Q1. If only a storage fault is determined, the failure may be located at the previous state information storage element Q2 or the change indicator storage element Q3, depending on the state of the change indicator storage element Q3. This way, a whole clock tree CT may be monitored for clock failures with the circuit 10 in operation.

Figure 7:
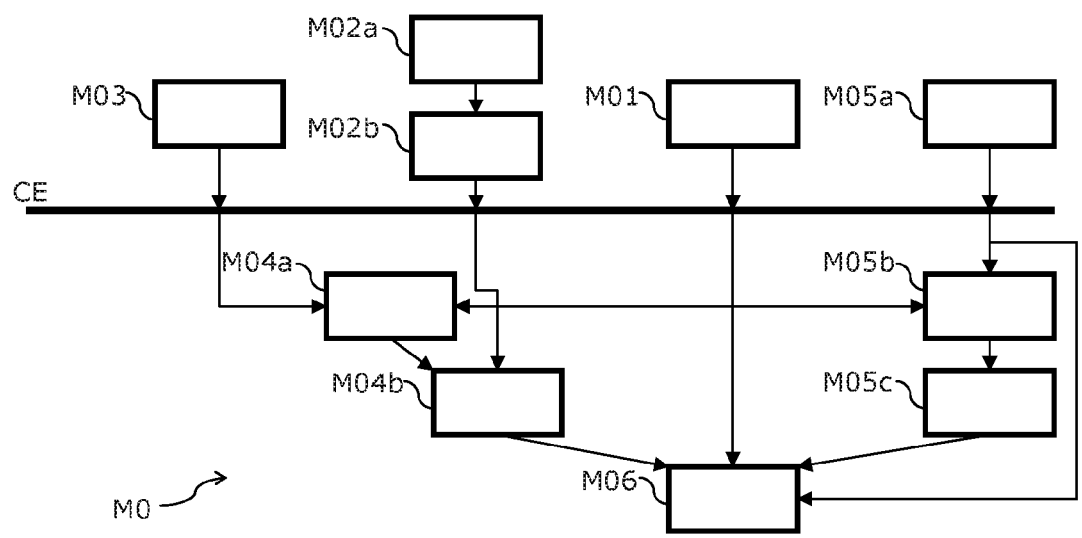
FIG. 7 schematically shows an exemplary embodiment of a method for monitoring a storage element.

FIG. 7 schematically illustrates a method M0 for monitoring a storage element with its monitoring circuits with respect to a clock signal c; for example by describing the operations before and after the clock active edge as well as the operations triggered by the clock edge. In this example, a positive clock edge is assumed to trigger the storage of information.

The method M0 comprises at M01 feeding a monitored state information storage element Q0 with state information d from a data input interface DIN clocked with a clock signal CLK, at M02a, detecting whether the current state information d0 of the monitored state information storage element Q0 is different from the state information d, followed by, at M02b, feeding the indicator for this difference to the change indicator storage element Q3 and thus generating a state change indicator x0 based on the detection result.

At M03, a previous state information storage element Q2 is fed with state information output d0 from the monitored state information storage element Q0.

In parallel to the above operations M01, M02a, M02b and M03, it may optionally be possible at M05a to feed a redundant state information storage element Q1 with state information d of the data input interface DIN.

Any of the above operations are performed before the edge CE of the clock signal CLK. With this edge CE the fed information is taken over by the respective storage elements.

After the clock edge CE, the method M0 comprises, at M04a, detecting whether the current state information d0 of the monitored state information storage element Q0 is different from the previous state information d2 from the previous state information storage element Q2, followed by, at M04b, generating a storage fault indicator SF based on comparison of the detection result and the state change indicator x0.

In parallel to M04a and M04b, at M05b the current state information d0 of the monitored state information storage element Q0 is compared with the current state information d1 of the redundant state information storage element Q1. At M05c a data fault indicator DF may optionally be generated, if the data output d0 of the monitored state information storage element Q0 and the data output d1 of the redundant state information storage element Q1 are not equivalent.

Additionally, after executing M04b and M05c it may be possible to select one of the data outputs of the monitored state information storage element Q0 and the redundant state information storage element Q1 as a corrected data output dependent on the evaluation of the storage fault indicator SF in combination with the data fault indicator DF at M06.

Figure 8:
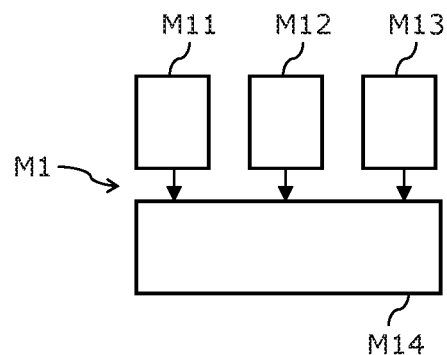
FIG. 8 schematically shows an exemplary embodiment of a method for detecting a failure in a clock tree.
Figure 9:
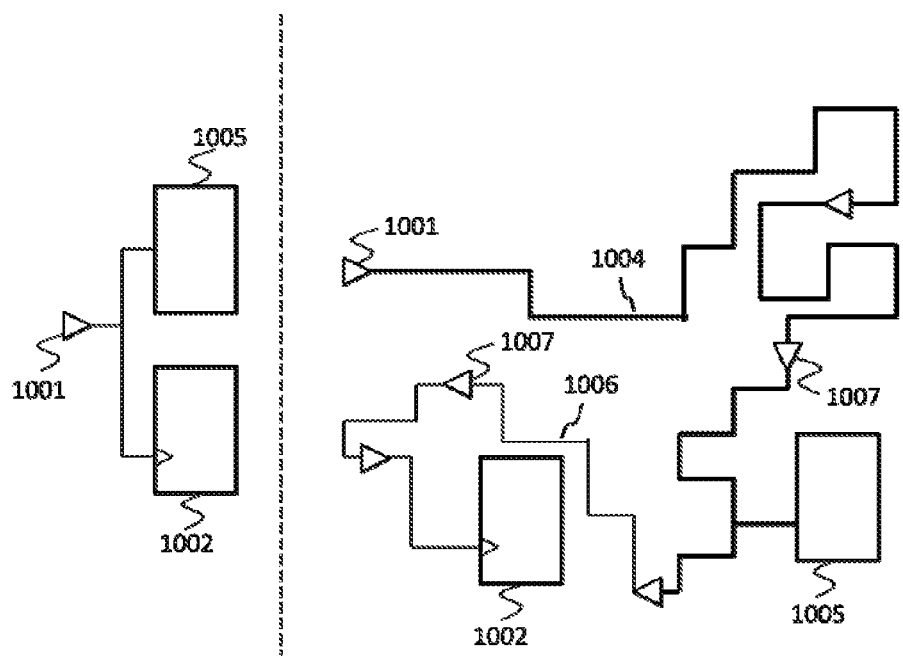
FIG. 9 schematically depicts an environment of a monitored clock tree with storage elements.

FIG. 8 schematically illustrates a method M1 for detecting a clock failure in a clock tree, for example the clock tree CT in FIGS. 5 and 6 used within an integrated circuit having a storage element with monitoring circuit as shown and explained in conjunction with FIGS. 1 to 4. The method M1 comprises at M11 a determination if a failure is present in the monitored state information storage element Q0. At M12, it may be determined, whether a failure is present in the previous state information storage element Q2. Similarly, at M13 it is determined, if a failure is present in the change indicator storage element Q3. The determined failure indications of M11 to M13 may then be used at M14 to determine a faulty clock signal of the clock tree CT depending on a combination of the determined failure indications.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. Conversely, if the logically true state is a logic level zero, the logically false state is a logic level one. It will be apparent to the skilled person in the field that the exemplarily depicted logic components and units in the figures may equally be implemented by inverse logic components and units being fed with respectively inverse logic signals or status bits.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different circuitry components. For example, the exemplary topology in the figures and the discussion thereof is presented merely to provide a useful reference in discussing various aspects of the invention. It should be understood by those skilled in the art that the description of the topology has been simplified for purposes of discussion, and it is just one of many different types of appropriate topologies that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device.

The invention claimed is:

1. A storage element with monitoring circuit, comprising:
a data input interface providing data;
a data output interface;
a clock signal input interface providing a clock;
a storage fault indicator interface;
a monitored state information storage element having a clock input terminal coupled to the clock signal input interface, a data input terminal coupled to the data input interface and a data output terminal;
a previous state information storage element having a clock input terminal coupled to the clock signal input interface, and a data input terminal coupled to the data output terminal of the monitored state information storage element, the previous state information storage element being configured to record the previous state of the monitored state information storage element;
a state change indication unit having a clock input terminal coupled to the clock signal input interface, the state change indication unit being configured to generate a state change indicator indicative of whether the monitored state information storage element shall have performed a state change by observing the data at the data input interface and the data at the output terminal of the monitored state information storage element; and
a state change confirmation unit coupled to the state change indication unit, the state change confirmation unit being configured to generate a storage fault indicator by observing the data at the output terminal of the monitored state information storage element and the data at the output of the previous state information storage element and checking whether the result of this observation is in line with the state change indicator.

2. The storage element with monitoring circuit of claim 1, wherein the state change indication unit comprises:
a first comparison element having a first input terminal coupled to the data input interface, a second input terminal coupled to the data output terminal of the monitored state information storage element and an output terminal; and
a change indicator storage element having a clock input terminal coupled to the clock signal input interface, and a data input terminal coupled to the output terminal of the comparison element, and an output terminal; the change indicator storage element being configured to issue the state change indicator at its output terminal.

3. The storage element with monitoring circuit of claim 1, wherein the state change confirmation unit comprises:
a second comparison element having a first input terminal coupled to the data output terminal of the monitored state information storage element, and a second input terminal coupled to the data output terminal of the previous state information storage element; and
a storage check unit configured to generate the storage fault indicator from the state change indicator and the output of the second comparison element, the storage fault indicator being indicative of whether or not the monitored state information storage element correctly stored data provided at its data input terminal.

4. The storage element with monitoring circuit of claim 1, further comprising:
a data fault unit, including a clock input terminal coupled to the clock signal input interface, a first data input terminal coupled to the data input interface, and a second data input terminal coupled to the data output terminal of the monitored state information storage element, wherein the data fault unit is configured to generate a data fault indicator when the data recorded by the monitored state information storage element does not match a redundant copy of this data within the data fault unit.

5. The storage element with monitoring circuit of claim 4, wherein the data fault unit comprises:

a redundant state information storage element having a clock input terminal coupled to the clock input signal interface and a data input terminal coupled to the data input interface, the redundant state information storage element being configured to provide a redundant copy of the data recorded by the monitored state information storage element; and a third comparison element configured to compare the data output of the monitored state information storage element with the data output of the redundant state information storage element and configured to generate a data fault indicator, when the data output of the monitored state information storage element and the data output of the redundant state information storage element are not equivalent.

6. The storage element with monitoring circuit of claim 1, further comprising:

a data fault detection and correction unit, having a clock input terminal coupled to the clock signal input interface, a first data input terminal coupled to the data input interface, and a second data input terminal coupled to the data output terminal of the monitored state information storage element, and a third input terminal connected to the storage fault indicator interface, the data fault detection and correction unit being configured to generate a data fault indicator when the data recorded by the monitored state information storage element does not match a redundant copy of this data within the data fault detection and correction unit, and to generate a corrected data output selected from the data output terminal of the monitored state information storage element and the redundant copy of this data depending on the storage fault indicator and the data fault indicator.

7. The storage element with monitoring circuit of claim 6, the data fault detection and correction unit further comprising:

a redundant state information storage element having a clock input terminal coupled to the clock input signal interface and a data input terminal coupled to the data input interface, the redundant state information storage element being configured to provide a redundant copy of the data recorded by the monitored state information storage element;

a third comparison element configured to compare the data output of the monitored state information storage element with the data output of the redundant state information storage element and configured to generate a data fault indicator, when the data output of the monitored state information storage element and the data output of the redundant state information storage element are not equivalent; and a data selection unit configured to select one of the original data output of the monitored state information storage element or data output output by the redundant state information storage element, dependent on the storage fault indicator and the data fault indicator and to provide the selected data at the data output interface.

8. An integrated circuit, comprising at least one storage element with monitoring circuit of claim 1.

9. The integrated circuit of claim 8, comprising at least one clock root that is driving the clock input terminal of a set of storage elements either directly or indirectly, the set of storage elements comprising at least the monitored state information storage element, the change indicator storage element and the previous state information storage element of a first one of the storage elements with monitoring circuit.

10. The integrated circuit of claim 9, wherein the change indicator storage element of the first one of the storage elements with monitoring circuit is arranged in a different clock signal subtree than the clock signal subtree driving the clock input terminal of the monitored state information storage element of the first one of the storage elements with monitoring circuit.

11. The integrated circuit of claim 8, wherein the previous state information storage element of the first one of the storage elements with monitoring circuit is arranged in a different clock signal subtree than the clock signal subtree driving the clock input terminal of the change indicator storage element of the first one of the storage elements with monitoring circuit.

12. A method for monitoring a state information storage element, the method comprising:

feeding a monitored state information storage element with state information from a data input interface clocked with a clock signal;

detecting whether the current state information of the monitored state information storage element is different from the state information fed in the next clock period and generating a state change indicator with the clock signal CLK based on the detection result;

feeding a previous state information storage element with state information output from the monitored state information storage element clocked with the clock signal; and detecting after the clock signal whether the current state information of the monitored state information storage element is different from the previous state information from the previous state information storage element and generating a storage fault indicator based on comparison of the detection result and the state change indicator.

13. The method of claim 12, further comprising:

feeding a redundant state information storage element with state information of the data input interface clocked with the clock signal in parallel to the monitored state information storage element; and comparing after the clock signal the data output of the monitored state information storage element with the data output of the redundant state information storage element and generating a data fault indicator, if the data output of the monitored state information storage element and the data output of the redundant state information storage element are not equivalent.

14. The method of claim 13, further comprising:

selecting one of the data outputs of the monitored state information storage element and the redundant state information storage element as a corrected data output dependent on the evaluation of the storage fault indicator in combination with the data fault indicator.

15. The method of claim 12, further comprising:

detecting a clock failure in a clock tree including:
  determining, if a failure is present in a monitored state information storage element;
  determining, if a failure is present in a previous state information storage element;
  determining, if a failure is present in a change indicator storage element; and
  determining a faulty clock signal subtree depending on a combination of the determined failure.

* * * * *